United States Patent [19]
Knors

[11] Patent Number: 5,738,920
[45] Date of Patent: *Apr. 14, 1998

[54] BLOOD COLLECTION TUBE ASSEMBLY

[75] Inventor: Christopher John Knors, Raleigh, N.C.

[73] Assignee: Becton, Dickinson and Company, Franklin Lakes, N.J.

[*] Notice: The term of this patent shall not extend beyond the expiration date of Pat. No. 5,545,375.

[21] Appl. No.: 594,078

[22] Filed: Jan. 30, 1996

[51] Int. Cl.⁶ .............................. A61J 1/06; B32B 15/16
[52] U.S. Cl. .................. 428/35.9; 425/36.7; 425/36.91; 425/448; 425/451; 425/689; 206/524.2; 206/524.3; 220/415; 220/456; 220/457; 604/403; 604/415

[58] Field of Search ................... 428/34.4, 34.6, 428/420, 461, 447, 448, 35.9, 36.7, 451, 701, 689, 36.91; 206/524.2, 524.3, 524.8; 220/415, 456, 457; 604/226, 403, 415; 128/771, 764; 422/102, 99, 58

[56] References Cited
U.S. PATENT DOCUMENTS 5,545,375  8/1996  Tropsch .................................. 422/102

*Primary Examiner*—Charles Nold
*Attorney, Agent, or Firm*—Nanette S. Thomas

[57] ABSTRACT

The present invention is a plastic container coated with a multi-layer barrier coating. The multi-layer barrier coating is useful for providing an effective barrier against gas permeability in containers and for extending shelf-life of containers, especially plastic evacuated blood collection devices.

17 Claims, 8 Drawing Sheets

BLOOD COLLECTION TUBE ASSEMBLY

BACKGROUND OF THE INVENTION

1. Field of the Invention

This invention relates to a multi-layer barrier coating for providing an effective barrier against gas and water permeability for containers, especially plastic blood collection tubes.

2. Description of the Related Art

With the increased emphasis on the use of plastic medical products, a special need exists for improving the barrier properties of articles made of polymers.

Such medical products that would derive a considerable benefit from improving their barrier properties include, but are not limited to, collection tubes and particularly those used for blood collection.

Blood collection tubes require certain performance standards to be acceptable for use in medical applications. Such performance standards include the ability to maintain greater than about 90% original draw volume over a one year period, to be radiation sterilizable and to be non-interfering in tests and analysis.

Therefore, a need exists to improve the barrier properties of articles made of polymers and in particular plastic evacuated blood collection tubes wherein certain performance standards would be met and the article would be effective and usable in medical applications.

SUMMARY OF THE INVENTION

The present invention is a plastic composite container with a multi-layer barrier coating disposed over the outer or inner surface of the previously formed composite container. Desirably, the barrier materials comprise a mixture of an inorganic oxide and a metal oxide applied to the surface of the previously formed composite container. Most preferably, the barrier materials comprises a first layer of a polymeric material applied to the surface of the previously formed composite container and a second layer of a mixture of an inorganic oxide and a metal oxide applied over the first layer.

The polymeric material is preferably a highly cross linked acrylate polymer. The coating may be formed either on an interior surface portion, on an exterior surface portion, or both of the container.

The mixture of an inorganic oxide and a metal oxide may preferably be a metal oxide chosen from metals of Group IVA and a silicon oxide based composition, such as $SiO_x$ wherein x is from 1.0 to about 2.5; or an aluminium oxide based composition. Most preferably, the mixture comprises $SnO_x$ and a silicon oxide based composition.

Preferably, the polymeric material is a blend of monoacrylate (i.e., isobornyl acrylate) and diacrylate monomers (i.e., an epoxy diacrylate or a urethane diacrylate) as described in U.S. Pat. Nos. 4,490,774, 4,696,719, 4,647,818, 4,842,893, 4,954,371 and 5,032,461, the disclosures of which are herein incorporated by reference. The polymeric material is cured by an electron beam or by a source of ultraviolet radiation.

Desirably, the polymeric material is formed of a substantially cross linked component selected from the group consisting of polyacrylates and mixtures of polyacrylates and monacrylates having an average molecular weight of between 150 and 1,000 and a vapor pressure in the range of $1 \times 10^{-6}$ to $1 \times 10^{-1}$ Torr at standard temperature and pressure. Most preferably, the material is a diacrylate.

Preferably, the thickness of the acrylate coating is about 0.1 to about 10 microns and most preferably from about 0.1 to about 5 microns.

Desirably, the mixture of an inorganic oxide and a metal oxide is preferably a mixture of a metal oxide such as $SnO_x$, $GeO_x$ or $PbO_x$ and a silicon or aluminum oxide. Such an oxide mixture is desirably deposited by means of plasma polymerization of a mixture comprising tetramethyltin, oxygen and a volatile organosilicon or organoaluminum compound in a magnetically enhanced audio frequency capacitively coupled discharge chamber.

Preferably, the thickness of the oxide mixture is about 50 Å to about 5000 Å and most preferably from about 750 to about 2000 Å.

The composition of the oxide mixture provides a dense, vapor-impervious coating over the first layer. Preferably, the thickness of the oxide mixture is about 500 to about 2,500 Angstroms (Å) and most preferably where the first layer is a polymeric material and the second layer is the oxide mixture the thickness of the second layer is greater than five times the thickness of the first layer. A coating above 5,000 Å may crack and therefore be ineffective as a barrier.

Optionally, another layer may be disposed over the mixture layer, preferably comprising vinylidene chloride-methyl methacrylate-methacrylate acrylic acid polymer (PVDC), thermosetting epoxy coatings, parylene polymers or polyesters.

Preferably, the thickness of the PVDC layer is about 2 to about 15 microns and most preferably from about 3 to about 5 microns.

The process for applying the polymeric material to a container is preferably carried out in a vacuum chamber wherein a curable monomer component is metered to a heated vaporizer system where the material is atomized, vaporized and condensed on the surface of the container. Following deposit of the monomer onto the surface of the container, it is cured by suitable means such as electron beam curing. The deposition and curing steps may be repeated until the desired number of layers has been achieved.

A method for depositing a mixture of inorganic oxide and metal oxide components is as follows: (a) pretreating the container with a first plasma coating of oxygen; (b) controllably flowing a gas stream including an organotin, organosilicon compound and oxygen or oxidizing gas compound into a plasma; and (c) depositing the oxide mixture onto the container while maintaining a pressure of less than about 500 mTorr during the depositing.

Although the pretreatment step is optional, it is believed that the pretreatment step provides for improved adherence qualities.

The organotin and organosilicon compounds may be combined with oxygen and optionally helium or another inert gas such as argon or nitrogen.

Preferably, the method for depositing a barrier coating on a substrate, such as a plastic collection tube comprises the following steps:

(a) selecting a curable component comprising: (i) polyfunctional acrylates, or (ii) mixtures of monoacrylates and polyfunctional acrylates;

(b) flash vaporizing said component into said chamber;

(c) condensing a first layer of a film of vaporized component onto the container;

(d) curing said film;

(e) applying a plasma surface treatment of oxygen on the film;

(f) vaporizing an organotin component and an organosilicon component with an oxidizer component and optionally an inert gas component to form a gas stream exterior to the chamber;

(g) establishing a glow discharge plasma in the chamber from one or more of the gas stream components;

(h) controllably flowing the gas stream into the plasma while confining at least a portion of the plasma therein; and (i) depositing a second layer adjacent said first layer.

Most preferably, the method for applying a barrier film coating to the interior wall surface of a container comprises the following steps:

(a) positioning the open end of the container to the vacuum manifold system;

(b) positioning the external surface of the container with means for imparting energy inside the container;

(c) evacuating the container;

(d) adding reactant gases such as tin and HDMSO into the container;

(e) imparting energy inside the container; and (f) generating a plasma inside the container and thus applying a barrier film coating to the interior wall surface of the container.

Preferably, the monomer source is an organosilicon component such as hexamethyldisiloxane, (HMDSO), tetraethoxysilane (TEOS) or tetramethylsilane (TMS).

Preferably, the oxidizer source is air, oxygen or nitrous oxide.

Preferably, the diluent gas source is an inert gas, such as helium, argon or a non-reactive gas such as nitrogen.

Preferably, the electrodes are inductively or capactively coupled metallic electrodes in the form of coils, pointed rods or flat or curved plates. Most preferably, the electrodes are energized with an energy source such as low frequency alternating current (AC), radio frequency (RF) or microwave frequency electrical potentials, either continuous or pulsed.

Most preferably, the method of applying a barrier coating to the interior wall surface of a container comprises the following steps:

(a) positioning the open end of the container to the vacuum manifold system;

(b) positioning the external surface of the container with electrodes that are connected to an energy source;

(c) maintaining a pressure of about 300 mTorr inside the container by evacuating the container with the vacuum pump;

(d) controllably flowing an organosilicon component with an oxidizer component and an optional inert gas component through the manifold system and into the container;

(e) energizing the electrodes so as to impart energy to the components inside the container;

(f) establishing a glow discharge plasma inside the container; and (g) depositing a barrier film coating onto the interior wall surface of the container.

Preferably, the method steps may be repeated wherein the electrodes in step (b) are repositioned on the external surface of the container.

Alternatively, the method steps may be repeated wherein the electrodes in step (b) are turned off and on and/or the flow of components in step (d) are turned off and on so as to pulse the plasma energy or component flow or both so as to enhance the barrier properties.

Therefore, the alternate method steps may be as follows:

(h) de-energizing the electrodes; and (i) energizing the electrodes so as to impart energy.

Another alternate method may be as follows:

(h) stopping the flow of components in step (d); and (i) then again controllably flowing the components as in step (d).

A further alternate method may be as follows:

(h) stopping the flow of components in step (d);

(i) de-energizing the electrodes in step (e); and (j) then repeating steps (d)–(g).

Optionally, the method steps may be repeated so as to assure that the barrier film coating is uniformly applied throughout the inside of the container or to apply a second barrier film coating.

Optionally, primer or planarization layers may be interposed between the plastic substrate and the first layer, oxygen plasma treatment of the first layer prior to the deposition of the second layer and use of other barrier enhancing layers on the second layer.

Plastic tubes coated with the multi-layer barrier coating and an overcoating layer are able to maintain substantially far better vacuum retention, draw volume and thermomechanical integrity retention than previous tubes comprised of polymer compositions and blends thereof without a coating of barrier materials or of tubes comprising only an oxide coating. In addition, the tube's resistance to impact is much better than that of glass. Most notably is the clarity of the multi-layer coating and its durability to substantially withstand resistance to impact and abrasion. Another attribute of the oxide mixture coatings is that they are stable as compared to conventional methods of medical sterilization, such as gamma irradiation or ethylene oxide (ETO).

Most preferably, the container of the present invention is a blood collection device. The blood collection device can be either an evacuated blood collection tube or a non-evacuated blood collection tube. The blood collection tube is desirably made of polyethylene terephthalate, polypropylene, polyethylene napthalate or copolymers thereof.

Printing may be placed on the multi-layer barrier coating applied to the container of interest. For example, a product identification, bar code, brand name, company logo, lot number, expiration date and other data and information may all be included on the barrier coating. Moreover, a matte finish or a corona discharged surface may be developed on the barrier coating so as to make the surface appropriate for writing additional information on the label. Furthermore, a pressure sensitive adhesive label may be placed over the barrier coating so as to accommodate various hospital overlabels, for example.

Preferably, the multi-layer barrier coating of the present invention provides a transparent or colorless appearance and may have printed matter applied thereon.

A further advantage is that the method of the present invention provides a reduction in the gas permeability of three-dimensional objects that has not been achieved with conventional deposition method typically used with thin films.

It has been found in the present invention that the organic material, acrylate, provides a good platform for the growth of the dense Group IVA oxide barrier material.

It has been found that a highly cross linked layer of acrylate improves the adhesion between a plastic surface and a layer of a mixture of an inorganic oxide and a metal oxide improves the thermomechanical stability of the coated system. In addition, acrylate primer coating has a role of a planarization (leveling) layer, covering the particles and imperfections on the surface of a polymer and reducing the defect density in the deposited inorganic coatings. The good bonding properties of the acrylate are also due to the fact that acrylate is polar and the polarity provides means for good bond formation between the oxide mixture and the acrylate. In addition, it has been found that a good bond formation is made between plastic tubes made of polypropylene and acrylate. Thus, the present invention provides the means of substantially improving the barrier properties of polypropylene tubes. The adhesion properties of both the acrylate coating and the mixture coating can be further substantially improved by surface pretreatment methods such as flame or oxygen plasma. Therefore, a significant reduction in permeability of the article is due to the substantially improved metal oxide surface coverage that is obtained by the use of a primer coating of acrylate on the plastic article surface.

A plastic blood collection tube coated with the multi-layer barrier coating of the present invention will not interfere with testing and analysis that is typically performed on blood in a tube. Such tests include but are not limited to, routine chemical analysis, biological inertness, hematology, blood chemistry, blood typing, toxicology analysis or therapeutic drag monitoring and other clinical tests involving body fluids. Furthermore, a plastic blood collection tube coated with the barrier coating is capable of being subjected to automated machinery such as centrifuges and may be exposed to certain levels of radiation in the sterilization process with substantially no change in optical or mechanical and functional properties.

DETAILED DESCRIPTION

The present invention may be embodied in other specific forms and is not limited to any specific embodiment described in detail which is merely exemplary. Various other modifications will be apparent to and readily made by those skilled in the art without departing from the scope and spirit of the invention. The scope of the invention will be measured by the appended claims and their equivalents.

Figure 1:
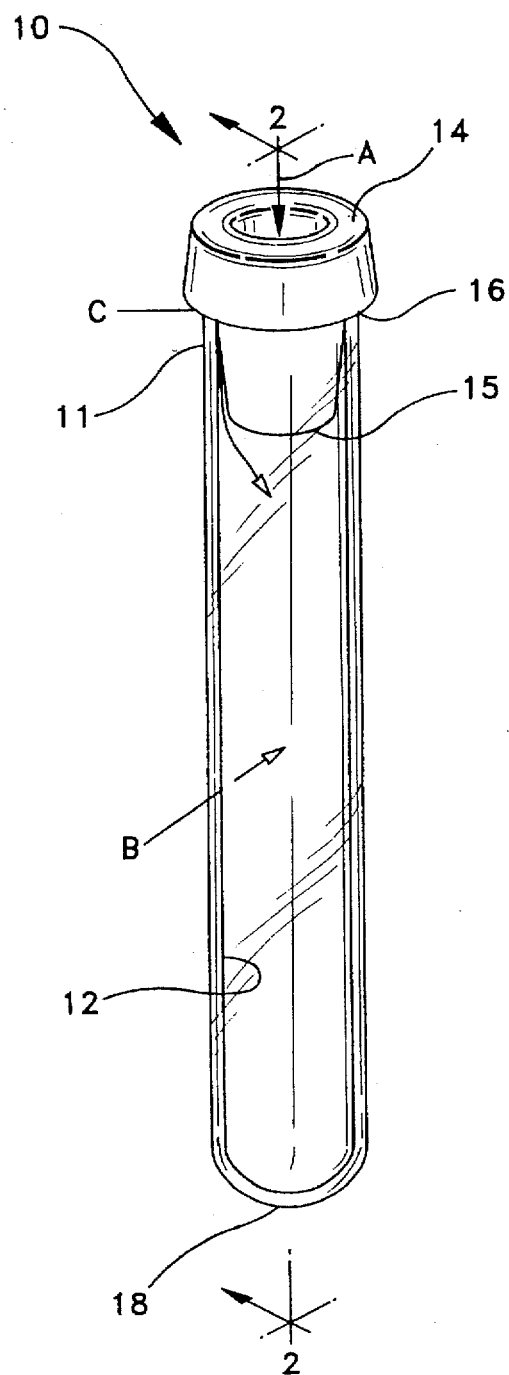
FIG. 1 is a perspective view of a typical blood collection tube with a stopper.
Figure 2:
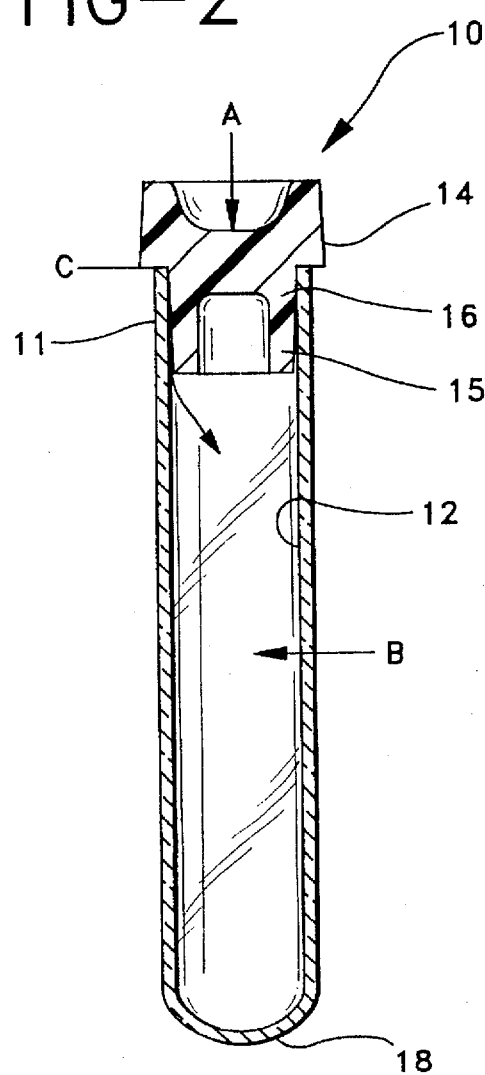
FIG. 2 is a longitudinal sectional view of the tube of FIG. 1 taken along line 2—2.

Referring to the drawings in which like reference characters refer to like parts throughout the several views thereof, FIGS. 1 and 2 show a typical blood collection tube 10, having a sidewall 11 extending from an open end 16 to a closed end 18 and a stopper 14 which includes a lower annular portion or skirt 15 which extends into and presses against the inner surface 12 of the sidewall for maintaining stopper 14 in place.

FIG. 2 schematically illustrates that there are three mechanisms for a change in vacuum in a blood collection tube: (A) gas permeation through the stopper material; (B) gas permeation through the tube and (C) leak at the stopper tube interface. Therefore, when there is substantially no gas permeation and no leak, there is good vacuum retention and good draw volume retention.

Figure 3:
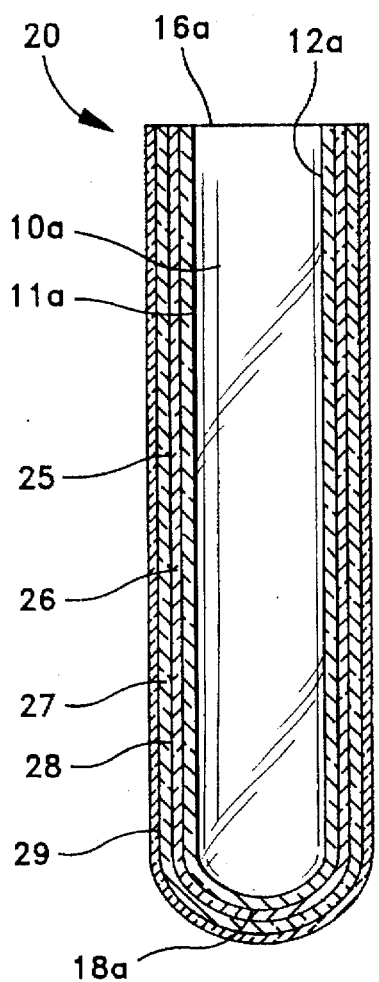
FIG. 3 is a longitudinal sectional view of a tube-shaped container similar to the tube of FIG. 1 without a stopper, comprising a multi-layer barrier coating.

FIG. 3 shows the preferred embodiment of the invention, a plastic tube coated with at least two layers of barrier materials. The preferred embodiment includes many components which are substantially identical to the components of FIGS. 1 and 2. Accordingly, similar components performing similar functions will be numbered identically to those components of FIGS. 1 and 2, except that a suffix "a" will be used to identify those components in FIG. 3.

Referring now to FIG. 3, the preferred embodiment of the invention, collection tube assembly 20 comprises a plastic tube 10a, having a sidewall 11a extending from an opened end 16a to a closed end 18a. A barrier coating 25 extends over a substantial portion of the outer surface of the tube with the exception of open end 16a. Barrier coating 25 comprises a first layer 26 of a polymer material, such as an acrylate material and a second layer 27 of a mixture of a Group IVA metal oxide material and a silicon oxide based composition and a third layer 28 of an organic overcoating layer such as PVDC.

Figure 4:
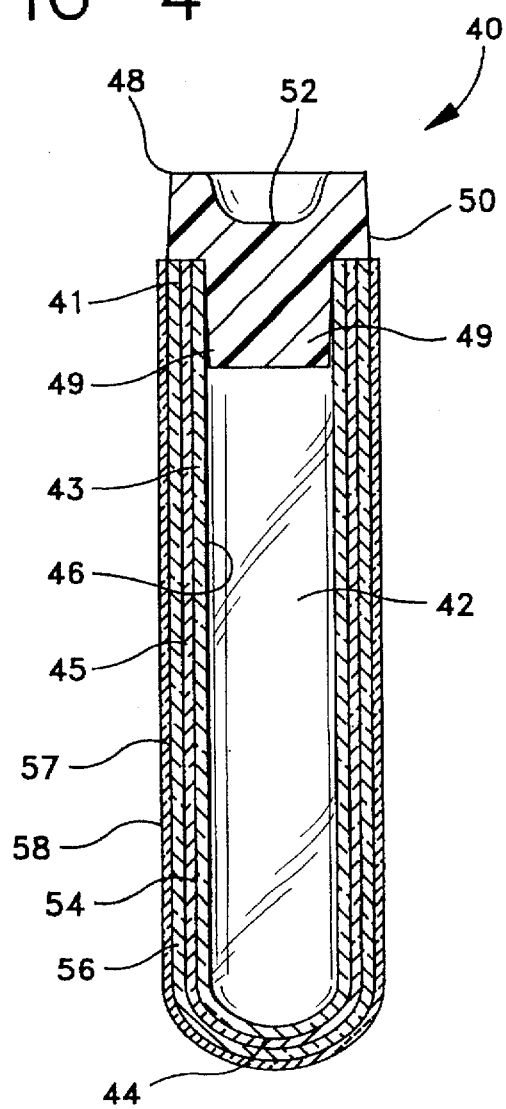
FIG. 4 is a longitudinal sectional view of a tube-shaped container, similar to the tube of FIG. 1 with a stopper, comprising a multi-layer barrier coating.

FIG. 4 illustrates an alternate embodiment of the invention, wherein collection tube assembly 40 comprises stopper 48 in place for closing open end 41 of tube 42. As can be seen, sidewall 43 extends from open end 41 to closed end 44 and stopper 48 includes an annular upper portion 50 which extends over the top edge of tube 42. Stopper 48 includes a lower annular portion or skirt 49 which extends into and presses against the inside inner surface 46 of sidewall 43 for maintaining stopper 48 in place. Also, the stopper has a septum portion 52 for receiving a cannula therethrough.

Thus, the user, once receiving a container such as that shown in FIG. 4 with a sample contained therein, may insert a cannula through septum 52 for receiving part or all of the contents in tube 42 to perform various tests on a sample. Coveting a substantial portion of the length of the tube is a multi-layer barrier coating 45. Multi-layer barrier coating 45 covers substantially most of the tube with the exception of open end 41 thereof. Multi-layer barrier coating 45 comprises a first layer 54 of a polymer material such as an acrylate, a second layer 56 of mixture of a metal oxide such as $SnO_x$, $GeO_x$ or $PbO_x$, and a silicon oxide material and a third layer 58 of an organic barrier material such as PVDC. FIG. 4 differs from the embodiment in FIG. 3 in that the tube may be evacuated with the simultaneous placement of stopper 48 therein after the application of layers 54 and 56 over the tube. Alternatively, the multi-layer barrier coating may be applied to the tube after it has been evacuated.

Figure 5:
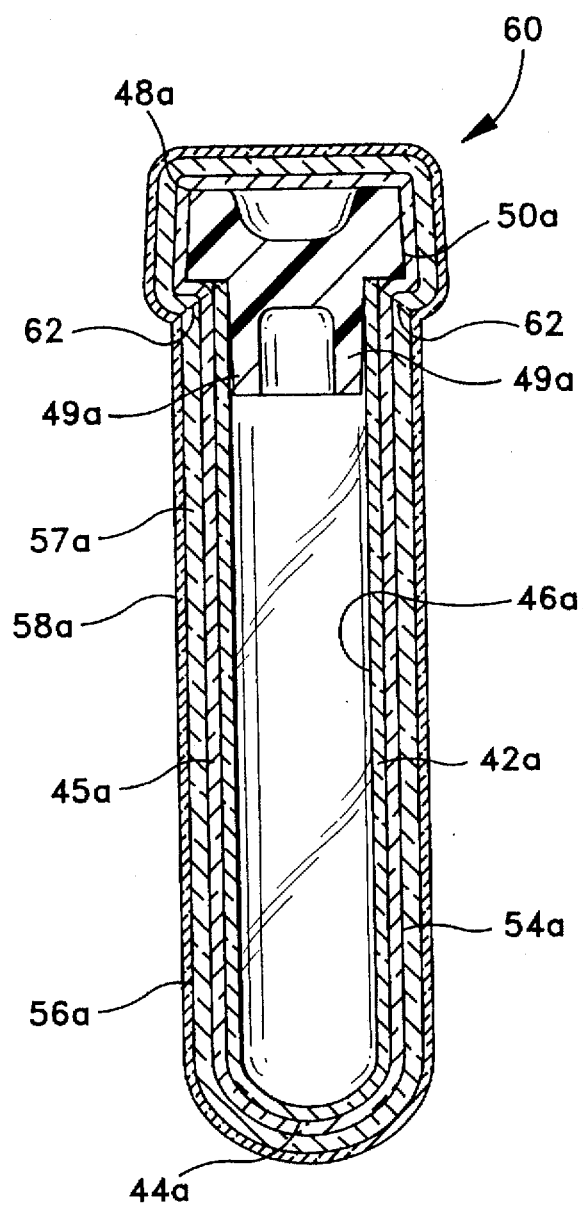
FIG. 5 is a longitudinal sectional view of a further embodiment of the invention illustrating the tube with a stopper similar to FIG. 1 and with the multi-layer barrier coating encompassing both the tube and stopper thereof.

FIG. 5 shows an additional embodiment of the barrier coating and a tube. The alternate embodiment functions in a similar manner to the embodiment illustrated in FIG. 4. Accordingly, similar components performing similar functions will be numbered identically to those components in the embodiment of FIG. 4, except that a suffix "a" will be used to identify those components in FIG. 5.

Referring now to FIG. 5, a further embodiment 60 of the invention wherein multi-layer barrier coating 45a incorporates both upper portion 50a of stopper 48a, as well as the entire outer surface of tube 42a. Multi-layer barrier coating 45a includes serrations 62 at the tube, stopper interface. The serrations are registered so that it can be determined if the sealed container has been tampered with. Such an embodiment may be utilized, for example, for sealing the container with the stopper in place. Once a sample has been placed in the tube, the sample cannot be tampered with by removal of the stopper. Additionally, the serrations may be registered so that it can be determined if the sealed container has been tampered with. Such an arrangement may be appropriate, for example, in drug abuse testing, specimen identification and quality control.

In an alternate embodiment of the invention, multi-layer barrier coating 45 is repeatedly or sequentially applied to the inner and/or outer surface of the tube. Preferably, the coating is applied at least twice.

It will be understood by practitioners-in-the-art, that such tubes may contain reagents in the form of additives or coatings on the inner wall of the tube.

The multi-layer barrier coating forms a substantially clear or translucent barrier. Therefore, the contents of a plastic tube with a multi-layer barrier coating comprising at least two layers of barrier materials are substantially visible to the observer at the same time identifying information may be displayed over the multi-layer barrier coating after it is applied to the plastic tube.

The first layer of the multi-layer barrier coating may be formed on the tube by dip-coating, roll-coating or spraying acrylate monomer or the blend of monomers, followed by the UV curing process.

The acrylate polymer material may also be applied to the tube by an evaporation and curing process carded out as described in U.S. Pat. No. 5,032,461, the disclosure of which is herein incorporated by reference.

The acrylate evaporation and curing process involves first atomizing the acrylate monomer into about 50 micron droplets and then flashing them off of a heated surface. This produces an acrylate molecular vapor which has the same chemistry as the starting monomer.

Acrylates are available with almost any chemistry desired. They usually have either one, two or three acrylate groups per molecule. Various mixtures of mono, di and tri acrylates are useful in the present invention. Most preferable are monoacrylates and diacrylates.

Acrylates form one of the most reactive classes of chemicals. They cure rapidly when exposed to UV or electron beam radiation to form a cross-linked structure. This imparts high temperature and abrasion resistant properties in the coating.

The monomer materials utilized are relatively low in molecular weight, between 150 and 1,000 and preferably in the range of 200 to 300 and have vapor pressures between about $1 \times 10^{-6}$ Torr and $1 \times 10^{-1}$ Torr at standard temperature and pressure (i.e., relatively low boiling materials). A vapor pressure of about $1 \times 10^{-2}$ Torr is preferred. Polyfunctional acrylates are especially preferred. The monomers employed have at least two double bonds (i.e., a plurality of olefin groups). The high-vapor-pressure monomers used in the present invention can be vaporized at low temperatures and thus are not degraded (cracked) by the heating process. The absence of unreactive degradation products means that films formed from these low molecular weight, high-vapor-pressure monomers have reduced volatile levels of components. As a result, substantially all of the deposited monomer is reactive and will cure to form an integral film when exposed to a source of radiation. These properties make it possible to provide substantially continuous coating despite the fact that the film is very thin. The cured film exhibits excellent adhesion and is resistant to chemical attack by organic solvents and inorganic salts.

Because of their reactivity, physical properties and the properties of cured films formed from such components, polyfunctional acrylates are particularly useful monomeric materials. The general formula for such polyfunctional acrylates is:

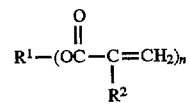

wherein:
$R^1$ is an aliphatic, alicyclic or mixed aliphatic-alicyclic radical;
$R^2$ is a hydrogen, methyl, ethyl, propyl, butyl or pentyl; and
n is from 2 to 4.

Such polyfunctional acrylates may also be used in combination with various monacrylates, such as those having the formula:

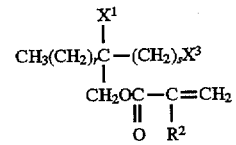

wherein:
$R^2$, is as defined above;
$X^1$ is H, epoxy, 1,6-hexanediol, tripropyleneglycol or urethane; and
r,s are 1–18.

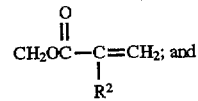

$X^3$ is CN or COOR$^3$ wherein $R^3$ is an alkyl radical containing 1–4 carbon atoms. Most often, $X^3$ is CN or COOCH$_3$.

Diacrylates of the formula below are particularly preferred:

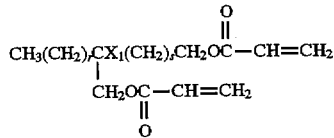

wherein:
$X_1$, r and s are as defined above.

Curing is accomplished by opening the double bonds of the reactant molecules. This can be accomplished by means of an energy source such as an apparatus which emits infrared, electrons or ultraviolet radiation.

Figure 6:
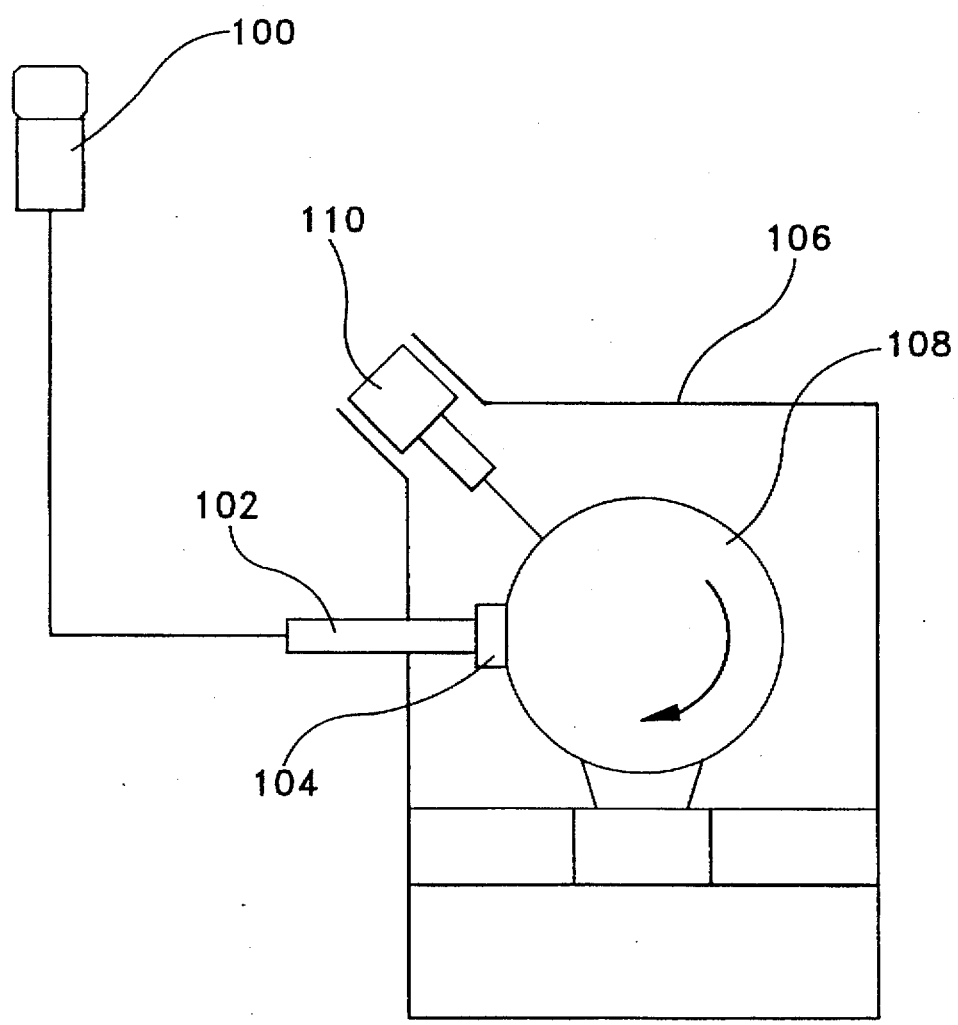
FIG. 6 illustrates an enlarged partially sectioned, diagram of a flash evaporator apparatus.

FIG. 6 illustrates the process for applying an acrylate coating. An acrylate monomer 100 is directed through a dielectric evaporator 102 and then through an ultrasonic atomizer 104 and into a vacuum chamber 106. The monomer droplets are atomized ultrasonically and the droplets vaporized where they condense on the rotating tube or film that is loaded on a drum 108.

The condensed monomer liquid subsequently is radiation cured by means of an electron beam gun 110.

The second layer of the multi-layer barrier coating, may be formed by radio frequency discharge, direct or dual ion beam deposition, sputtering or plasma enhanced chemical vapor deposition, as described in U.S. Pat. Nos. 4,698,256, 4,809,876, 4,992,298 and 5,055,318, the disclosures of which are herein incorporated by reference.

For example, a method of depositing the second layer is provided by establishing a glow discharge plasma in a previously evacuated chamber. The plasma is derived from one or more of the gas stream components, and preferably is derived from the gas stream itself. The article is positioned in the plasma, preferably adjacent the confined plasma, and the gas stream is controllably flowed into the plasma. The thickness of the second layer is about 50 Å to about 5000 Å and preferably at about 750 Å to about 2000 Å. The barrier based film is deposited on the substrate to a desired thickness. A thickness of less than about 5,000 Å may not provide sufficient barrier and a thickness of greater than about 5,000 Å may crack, thus decreasing the effective barrier. Most preferably, the thickness of the third oxide coating is about 1,000 Å to about 3,000 Å.

Another method of depositing a barrier coating is by confining a plasma with magnets. Preferably, the magnetically enhanced method for depositing a silicon oxide based film on a substrate is preferably conducted in a previously evacuated chamber of glow discharge from a gas stream. The gas stream preferably comprises at least two components: volatilized organosilicon and organotin components and an oxidizer component such as oxygen, nitrous oxide, carbon dioxide or air and an optionally inert gas component.

Examples of suitable organosilicon and organotin compounds useful for the gas stream in the plasma deposition methods are liquid or gas at about ambient temperature and have a boiling point about 0° C. to about 200° C. and include tetramethyltin, tetraethyltin, tetraisopropyltin, tetraallyltin, dimethysilane, trimethylsilane, diethylsilane, propylsilane, phenylsilane, hexamethyldisilane, 1,1,2,2-tetramethyldisilane, bis(trimethylsilane)methane, bis(dimethylsilyl) methane, hexamethyldisiloxane, vinyl trimethoxy silane, vinyl triethyoxysilane, ethylmethoxysilane, ethyltrimethoxysilane, divinyltetramethyldisiloxane, hexamethyldsilazane divinyl-hexamethyllrisiloxane, trivinylpentamethyltrisiloxazane, tetraethoxysilane and tetramethoxysilane.

Among the preferred organosilicons are 1,1,3,3-tetramethyldisiloxane, trimethylsilane, hexamethyldisiloxane (HMDSO), vinyltrimethylsilane, methyltrimethoxysilane, vinyltrimethoxysilane and hexamethyldisilazane. These preferred organosilicon compounds have boiling points of 71° C., 55.5° C., 102° C., 123° C. and 127° C. respectively.

The optional inert gas of the gas stream preferably is helium, argon or nitrogen.

The volatilized organotin and organosilicon components are preferably admixed with the oxygen component and the inert gas component before being flowed into the chamber. The quantities of these gases being so admixed are controlled by flow controllers so as to adjustably control the flow rate ratio of the gas stream components.

Various optical methods known in the art may be used to determine the thickness of the deposited film while in the deposition chamber, or the film thickness can be determined after the article is removed from the deposition chamber.

The deposition method of the present invention is preferably practiced at relatively high power and quite low pressure. A pressure less than about 500 millitorr (mTorr) should be maintained during the deposition, and preferably the chamber is at a pressure between about 43 to about 490 millitorr during the deposition of film. Low system pressure results in lower deposition rates whereas higher system pressure provides faster deposition rates. When the plastic article to be coated is heat sensitive, a higher system pressure may be used to minimize the mount of heat the substrate is exposed to during deposition because high substrate temperatures are to be avoided for low Tg polymers such as polypropylene and PET (Tg is −10° C. and 60° C. respectively).

The substrate is electrically isolated from the deposition system (except for electrical contact with the plasma) and is at a temperature of less than about 80° C. during the depositing. That is, the substrate is not deliberately heated.

Figure 7:
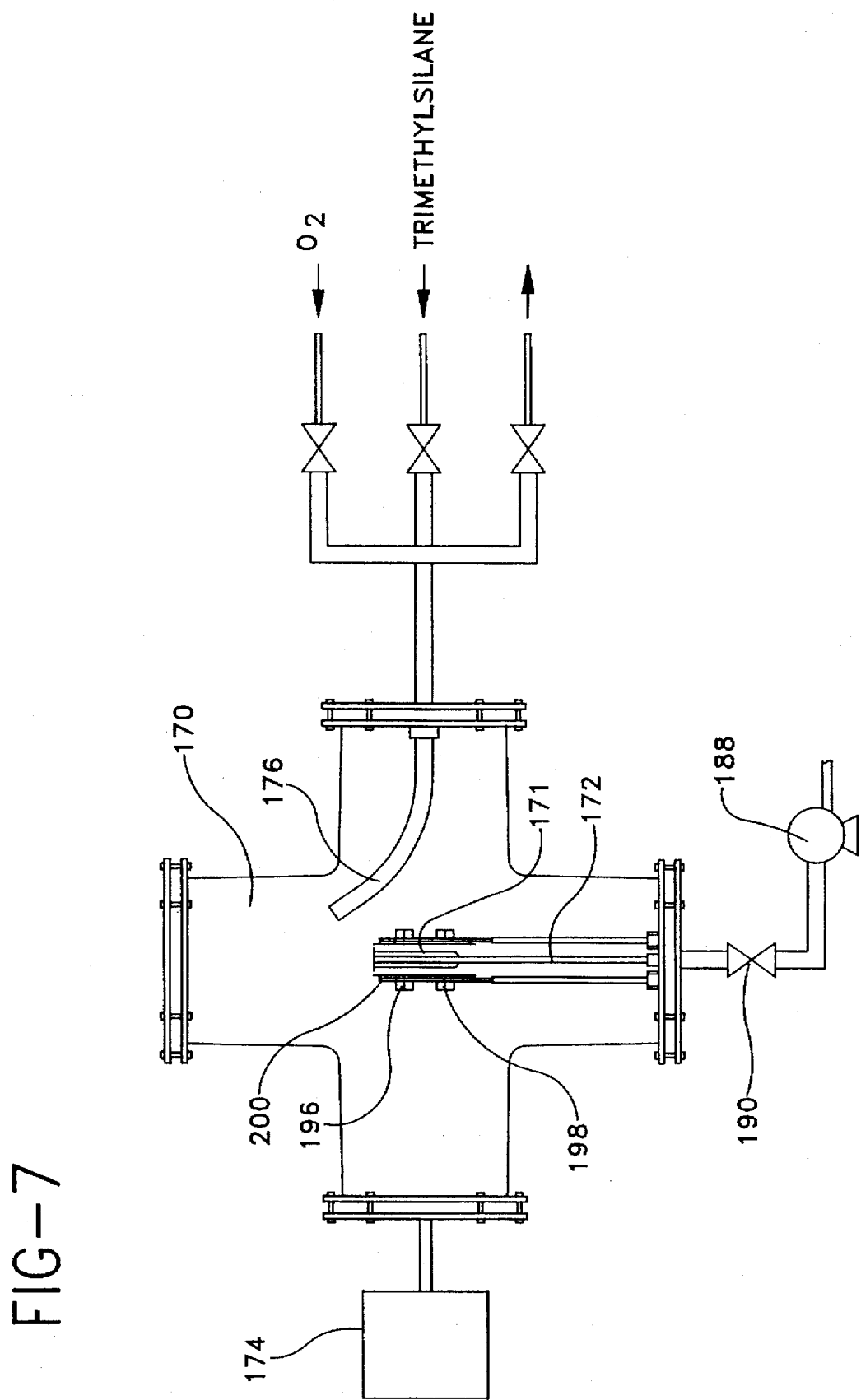
FIG. 7 illustrates a plasma deposition system.

Referring to FIG. 7, the system for depositing a barrier coating, including the second layer comprises an enclosed reaction chamber 170 in which a plasma is formed and in which a substrate or tube 171, is placed for depositing a thin film of material on a sample holder 172. The substrate can be any vacuum compatible material, such as plastic. One or more gases are supplied to the reaction chamber by a gas supply system 173. An electric field is created by a power supply 174.

The reaction chamber can be of an appropriate type to perform any of the plasma-enhanced chemical vapor deposition (PECVD) or plasma polymerization processes. Furthermore, the reaction chamber may be modified so that one or more articles may be coated with the oxide mixture layer simultaneously within the chamber.

The pressure of the chamber is controlled by a mechanical pump 188 connected to chamber 170 by a valve 190.

The tube to be coated is first loaded into chamber 170 in sample holder 172. The pressure of the chamber is reduced to about 5 mTorr by mechanical pump 188. The operating pressure of the chamber is about 90 to about 140 mTorr for a PECVD or plasma polymerization process and is achieved by flowing the process gases, oxygen and barrier precursor, into the chamber through monomer inlet 176.

The thin film is deposited on the surface of the tube and has a desired uniform thickness or the deposition process may be interrupted periodically to minimize heating of the substrate and/or electrodes and/or physically remove particulate matter from the articles.

Magnets 196 and 198 are positioned behind electrode 200 to create an appropriate combination of magnetic and electrical fields in the plasma region around the tube.

The system is suitable for low frequency operation. An example frequency is 40 kHz. However, there can be some advantages from operating at a much higher frequency, such as in the radio frequency range of several megahertz.

Figure 8:
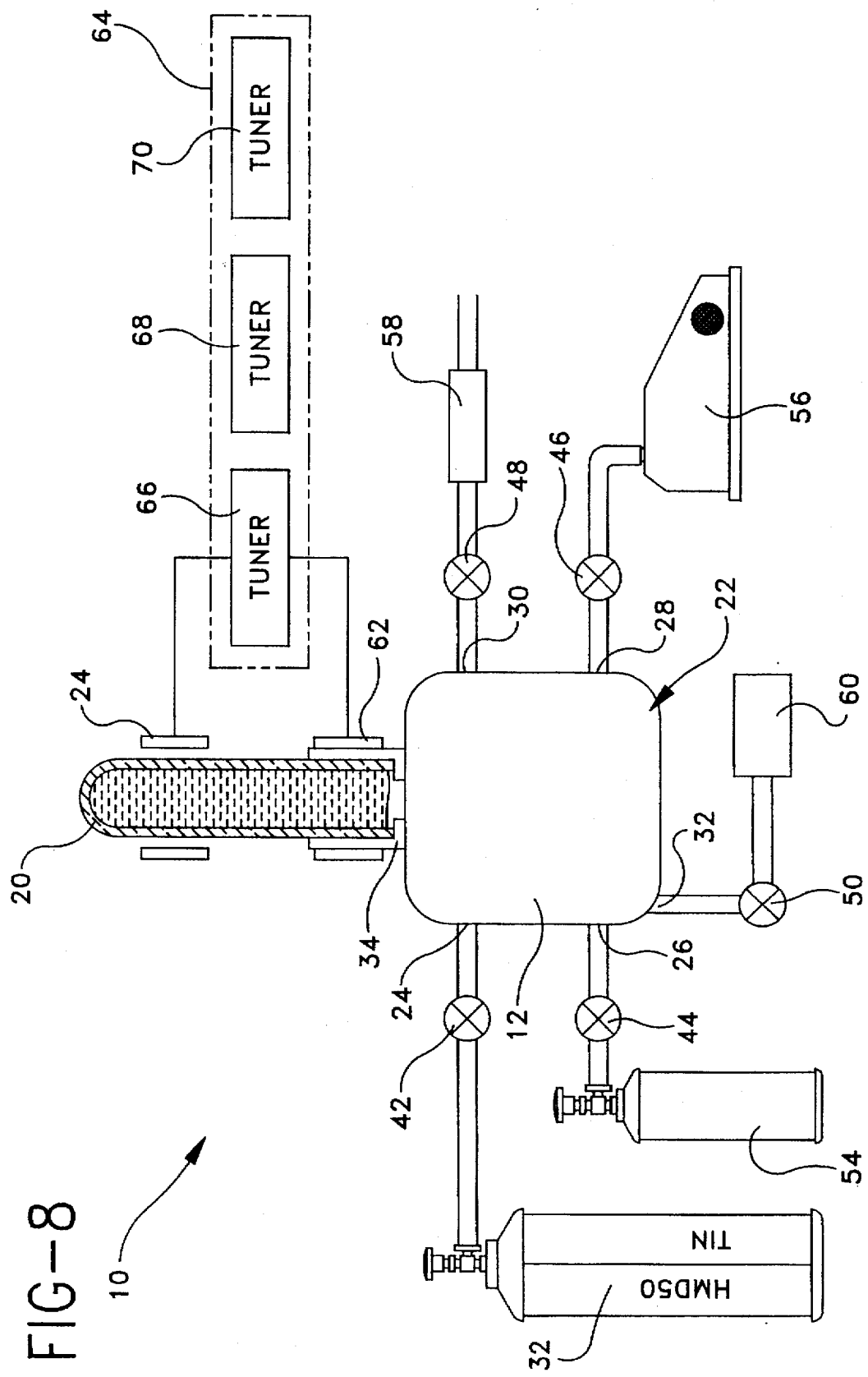
FIG. 8 is a general schematic diagram illustrating the apparatus for plasma generation.

Referring to FIG. 8, an apparatus of the present invention includes a vacuum manifold system 22. The vacuum manifold system includes at least five connections 24, 26, 28, 30 and 32 and a coupling port 34 that is desirably a rubber grommet.

Connections 24, 26, 28, 30 and 32 lead to isolation gate valves 42, 44, 46, 48 and 50 respectively. Valves 42, 44, 46, 48 and 50 lead respectively to a monomer gas source 52, an oxidizer gas source 54, a vacuum pump 56, a vent filter 58 and a diluent gas source 60 respectively. The apparatus further includes means for creating energy including an external electrode system 62 and an energy source 64. The energy source preferably includes a tuner 66, an amplifier 68 and an oscillator 70.

After the tube has been fabricated by any suitable plastic tube forming method, such as injection molding, extrusion with end-capping, blow molding, injection blow molding, etc., the open end of the tube is first connected to the vacuum manifold system at the coupling port and all valves are in a closed position. Then valve 46 is opened and the vacuum pump is initiated to reduce the pressure in the tube to the vacuum region of about 0.001 mTorr to about 100 mTorr.

The reactant gas components necessary for the plasma to form inside the tube are then introduced by way of the manifold system into the tube. Valve 42 is first opened so that the monomer gas component flows into the manifold system at a pressure of about 125 mTorr, a flow rate of about 1.0 sccm, and a room temperature of about 74° F. Then valve 44 is opened so that the oxidizer gas component flows into the manifold system at a pressure of about 175 mTorr, flow rate of about 22 sccm and a temperature of about room temperature or about 74° F.

The monomer gas component and the oxidizer gas component are preferably admixed with the inert gas component in the manifold system before being flowed into the tube. The quantities of these gases being so admixed are controlled by flow controllers so as to adjustably control the flow rate ratio of the reactant gas stream components. The mixture of the reactant gas components is achieved inside the tube prior to energizing the electrical system.

Most preferably, the monomer gas component is preferably HMDSO and the oxidizer gas component is preferably oxygen so as to form and deposit a barrier coating of silicone oxide ($SiO_x$) on the internal wall surface of a tube.

The barrier coating is deposited on the internal surface of the tube to a desired thickness. The thickness of the coating is about 500 Angstroms (Å) to about 5000 Å. Most preferably, the thickness of the oxide coating is about 1000 Å to about 3000 Å.

Optionally, a general control system including a computer control portion, is connected to each of the components of the system in a manner to receive status information from and send controlling commands to them.

Suitable pressure of the reactant gas mixture is between about 70 mTorr and about 2000 mTorr, preferably between about 150 mTorr and 600 mTorr and most preferably about 300 mTorr.

Desirably, an organosilicon such as HMDSO and tetramethyltin are used as the monomer gas components at a flow rate of about 0.1 to 50 sccm, at (25° C.) and from about 80 mTorr to about 190 mTorr preferably at about 0.5 sccm to about 15 sccm and most preferably at about 1.0 sccm.

Desirably, air is used as the oxidizer gas component at a flow rate of about 0.1 to about 50 sccm, (at 25° C.) and from about 110 mTorr to about 200 mTorr, preferably at about 15 to about 35 sccm and most preferably at about 22 sccm.

The barrier film blend thereof used in accordance with this disclosure, may contain conventional additives and ingredients which do not adversely affect the properties of articles made therefrom.

The optional third layer of the multi-layer barrier coating may be formed on the second layer by dip-coating, roll-coating or spraying an aqueous emulsion of the polyvinylidene chloride or homo- or co-polymers, followed by air drying.

The third layer may preferably be vinylidene chloride-acrylonitrile-methyl methacrylate-methyl acrylate-acrylic acid copolymers, thermosetting epoxy coatings, parylene polymers, or polyesters.

Preferably, the third layer is a parylene polymer. Parylene is the generic name for members of the polymer series developed by Union Carbide Corporation. The base member of the series, called parylene N, is poly-p-exlylene, a linear, crystalline material:

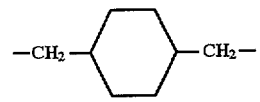

Parylene C, a second member of the parylene series is produced from the same monomer as parylene N and modified by the substitution of a chlorine atom for one other aromatic hydrogens:

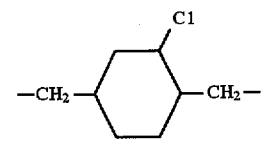

Parylene D, the third member of the parylene series is produced from the same monomer as parylene N and modified by the substitution of the chlorine atom for two of the aromatic hydrogens:

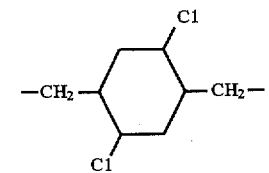

Most preferably, the polymer layer is a vinylidene chloride-methyl methacrylate-methacrylate acrylic acid polymer (PVDC). This polymer is available as DARAN® 8600-C (trademark of W. R. Grace and Co.) sold by GRACE, Organic Chemicals Division, Lexington, Mass.

The third layer of the barter coating, a polymer material, may be a parylene polymer applied to the second layer by a process similar to vacuum metallizing, as described in U.S. Pat. Nos. 3,342,754 and 3,300,332, the disclosures of which are herein incorporated by reference. Alternatively, the third layer may be vinylidene chloride-acrylonitrile-methyl methacrylate-methyl acrylate-acid acrylic polymer, applied to the second layer by dip-coating, roll-coating or spraying an aqueous emulsion of the polymer, followed by air drying of the coating, as described in U.S. Pat. Nos. 5,093,194 and 4,497,859, the disclosure of which are herein incorporated by reference.

Figure 9:
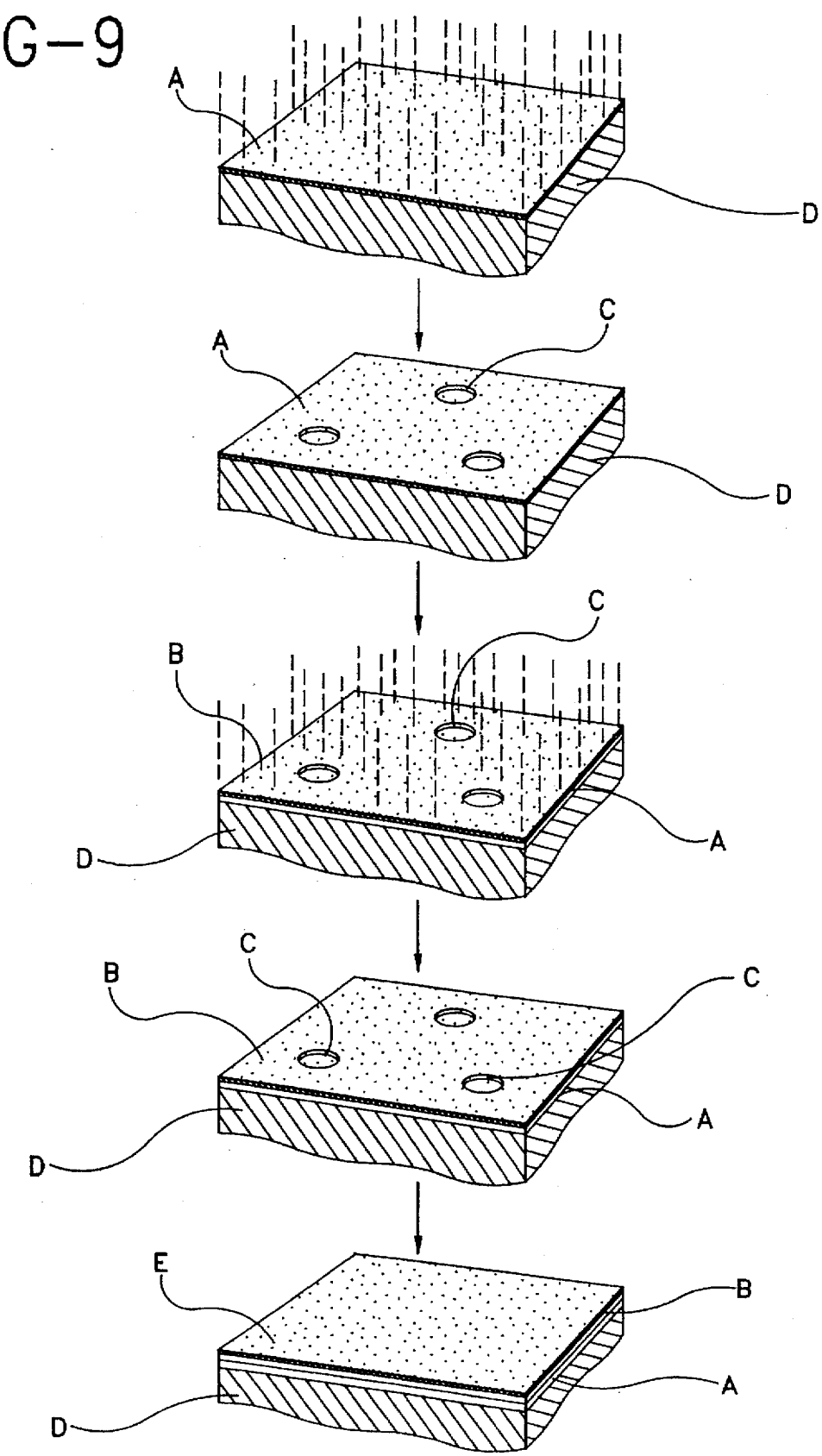
FIG. 9 is a general schematic diagram illustrating the layers being deposited on a substrate.

As shown in FIG. 9, the acrylate coating A and the second mixed layer B may have defects or irregularities C. It is believed that a completely defect-free coverage of the substrate D cannot be achieved with only the acrylate and mixed layer. Therefore, a third coating of PVDC, E is applied over the layer to produce a substantially defect-free barter coating over the substrate surface.

A variety of substrates can be coated with a barter coating by the process of the present invention. Such substrates include, but are not limited to packaging, containers, bottles, jars, tubes and medical devices.

A plastic blood collection tube coated with the multi-layer barrier coating will not interfere with testing and analysis that is typically performed on blood in a tube. Such tests include but are not limited to, routine chemical analysis, biological inertness, hematology, blood chemistry, blood typing, toxicology analysis or therapeutic drag monitoring and other clinical tests involving body fluids. Furthermore, a plastic blood collection tube coated with the barrier coating is capable of being subjected to automated machinery such as centrifuges and may be exposed to certain levels of radiation in the sterilization process with substantially no change in optical or mechanical and functional properties.

A plastic blood collection tube coated with the multi-layer barrier coating is able to maintain 90% original draw volume over a period of one year. Draw volume retention depends on the existence of a particle vacuum, or reduced pressure, inside the tube. The draw volume changes in direct proportion to the change in vacuum (reduced pressure). Therefore, draw volume retention is dependent on good vacuum retention. A plastic tube coated with a barrier coating substantially prevents gas permeation through the tube material so as to maintain and enhance the vacuum retention and draw volume retention of the tube. Plastic tubes without the multi-layer coating of the present invention may maintain about 90% draw volume for about 3 to 4 months.

If the multi-layer barrier coating is also coated or applied on the inner surface of the plastic blood collection tube, the barrier coating may be hemorepellent and/or have characteristics of a clot activator.

It will be understood that it makes no difference whether the plastic composite container is evacuated or not evacuated in accordance with this invention. The presence of a barrier coating on the outer surface of the container has the effect of maintaining the general integrity of the container holding a sample so that it may be properly disposed of without any contamination to the user. Notable is the clarity of the barrier coating as coated or applied on the container and its abrasion and scratch resistance.

The barrier coating used in accordance with this disclosure, may contain conventional additives and ingredients which do not adversely affect the properties of articles made therefrom.

The following examples are not limited to any specific embodiment of the invention, but are only exemplary.

EXAMPLE 1

A polypropylene (PP) tube was connected to the vacuum manifold system and with external parallel plate electrodes surrounding the outside of the tube. A vacuum of about 60 mTorr was first drawn inside the tube. Then air at about 200 m Torr was introduced into the tube through the manifold system and the electrodes were energized at 30 watts from a 38 MHz oscillator for about 30 seconds to provide a surface activation treatment. While the plasma was energized, a monomer gas mixture of tetramethyltin and hexamethyldisilxane vapor (1:20 v/v) was added into the tube through the manifold until the total pressure of the gas mixture was about 250 mTorr. The plasma deposition was maintained for about 5 minutes, followed by a 90 second air treatment.

After $SnO_x/SiO_x$ was deposited on the interior wall surface of the tube, the tube was disconnected from the manifold.

EXAMPLE 2

A PET tube was connected to the vacuum manifold system and to external parallel plate electrodes surrounding the outside of the tube. A vacuum of about 60 mTorr was first drawn inside the tube. Then air was introduced into the tube at a pressure of about 150 mTorr. Then a mixture of tetramethyltin and hexamethyldisiloxane (1:20 v/v) vapor was introduced into the tube until the total pressure of the gas mixture inside the tube was about 200 Torr. The electrodes were energized at 38 MHz and 22 Watts for about 5 minutes so that a plasma was generated inside the tube.

After $SnO_x/SiO_x$ was deposited on the interior wall of the tube, the tube was disconnected from the manifold.

EXAMPLE 3

Figure 10:
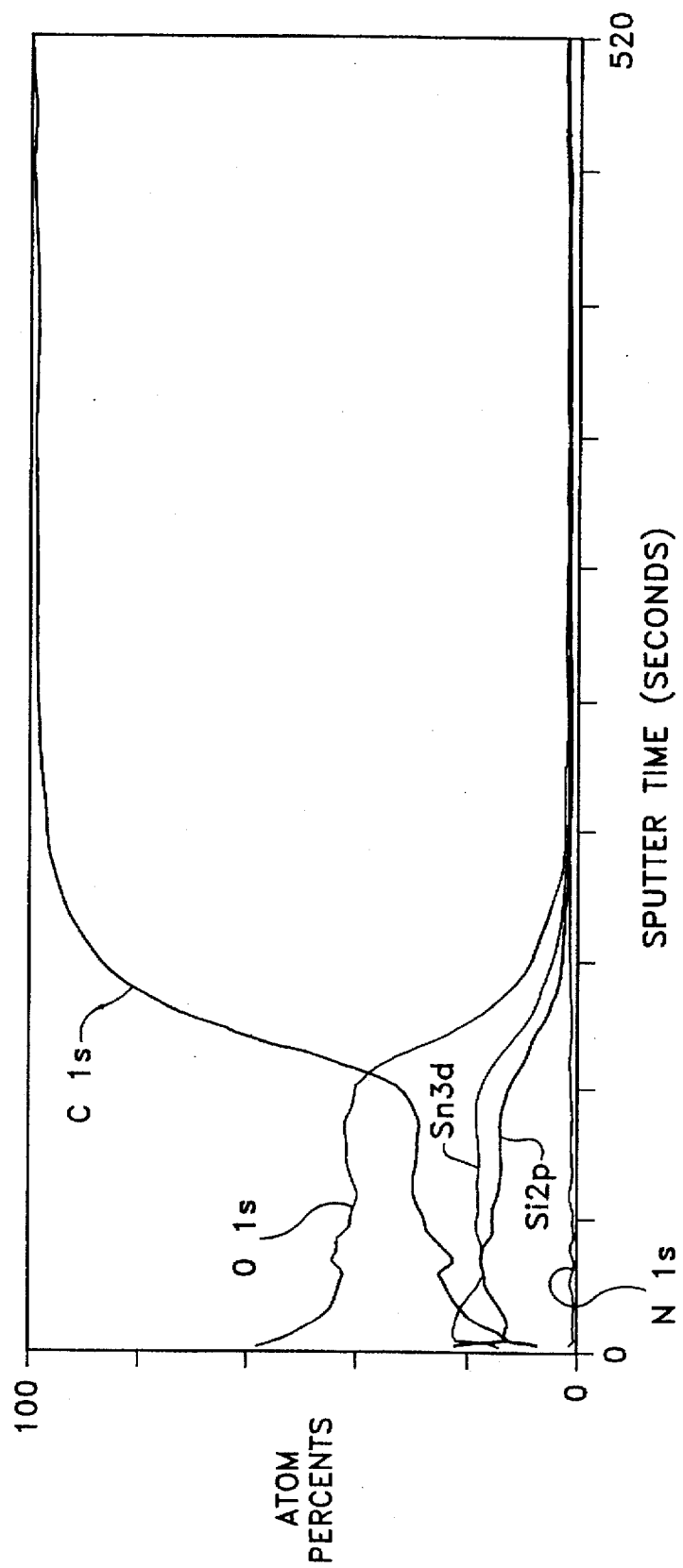
FIG. 10 ESCA spectra of the mixture of a Group IVA compound and a silicon oxide compound.

A Surface Science Model SSx-100 X-ray photoelectron spectrometer (ESCA) was used to determine the atom % of the elements present in the oxide coatings. Film samples were placed inside the spectrometer and the elemental composition was determined of approximately 100 Å into the surface. The surface was then argon ion etched as follows: 5000V and 9–10 mA argon ion beam was directed at the sample surface. After 5 seconds the ESCA spectra was taken and this procedure was repeated for a total of 5 times. The etch time was then increased to 20 seconds followed by ESCA and this process was repeated for a total of ten times. Finally, the etch time was increased to 40 seconds and the ESCA spectra was obtained until the bulk acrylate or the polymer substrate was reached. The oxide layer was clearly indicated by the presence of silicon in the ESCA spectra between the etch times of about 0 through about 1.3 minutes. The results are reported in FIG. 10.

What is claimed is:

1. A sample assembly comprising:
   a plastic container having an open end, a closed end, an inner surface and an outer surface; and
   a multi-layer barrier coating associated over the surface of said container and extending over a major portion of said surface of said container, said coating having a first layer comprising an acrylate primer coating material and a second layer on said first layer comprising a mixture of a metal oxide and an inorganic oxide material.

2. The assembly of claim 1, further comprising a closure in said open end of said container whereby a container and closure interface is formed.

3. The assembly of claim 2, wherein said plastic container is a tube and said closure is an elastomeric stopper.

4. The assembly of claim 1, wherein said barrier coating extends substantially from said open end of said container to and over said closed end of said container.

5. The assembly of claim 3, wherein said barrier coating extends from a portion of said elastomeric stopper to a point adjacent said closed end of said container.

6. The assembly of claim 2, wherein said assembly is a tube.

7. The assembly of claim 5, wherein said multi-layer barrier coating includes registered tamper serrations adjacent to said container and said closure interface.

8. The assembly of claim 1, wherein said first layer is a polymerized blend of mono- and di-acrylates.

9. The assembly of claim 1, wherein said second layer is a mixture of $SnO_x$, $GeO_x$ or $PbO_x$ and aluminum oxide or silicon oxide based composition.

10. The assembly of claim 9, wherein said second layer is deposited by radio-frequency discharge, direct ion beam deposition, dual ion beam deposition, sputtering, plasma enhanced chemical vapor deposition or magnetically enhanced plasma systems.

11. The assembly of claim 1, further comprising a said third layer adjacent said second layer of a thermosetting epoxy, parylene polymer, homo-polymers, co-polymers, polyesters or vinylidene chloride.

12. The assembly of claim 11, wherein said first layer comprises polymerized acrylate and said second layer comprises a mixture of tin and silicon oxide and said third layer comprises polyvinylidene chloride.

13. The assembly of claim 1, further comprising a multilayer barrier coating over the inner surface of said container, having a first layer including an acrylate primer coating material, a second layer on said first layer of a mixture of metal oxide and an inorganic material.

14. The assembly of claim 1, wherein said first layer is deposited on said outer surface of said container in a previously evacuated chamber comprising the following steps:
 (a) selecting a curable component comprising: i) polyfunctional acrylates, or ii) mixtures of monoacrylates and polyfunctional acrylates;
 (b) flash vaporizing said component into said chamber;
 (c) condensing a film of vaporized component onto the outer surface of said container; and
 (d) curing said film.

15. The assembly of claim 14, wherein said second layer is deposited on said first layer by the following steps:
 (a) vaporizing an organotin component, an organosilicon component and admixing the volatilized components with an oxidizer component and optionally an inert gas component to form a gas stream exterior to the chamber;
 (b) establishing a glow discharge plasma in the chamber from one or more of the gas stream components;
 (c) controllably flowing the gas stream into the plasma while confining at least a portion of the plasma therein; and
 (d) depositing a layer of a mixture of tin oxide and silicon oxide adjacent said first layer.

16. The assembly of claim 15, wherein said oxidizer component is oxygen nitrous oxide, carbon dioxide, air or an inert gas.

17. The assembly of claim 15, wherein the plastic substrate is electrically isolated from the chamber except for contact with the confined plasma.

* * * * *